United States Patent
Dudman et al.

(10) Patent No.: US 7,983,776 B2
(45) Date of Patent: Jul. 19, 2011

(54) SYSTEM AND METHOD FOR MATCHING SILICON OXIDE THICKNESS BETWEEN SIMILAR PROCESS TOOLS

(75) Inventors: Miles Dudman, Mountain View, CA (US); Andrew Le, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 425 days.

(21) Appl. No.: 11/937,027

(22) Filed: Nov. 8, 2007

(65) Prior Publication Data
US 2009/0125140 A1    May 14, 2009

(51) Int. Cl.
*G06F 19/00* (2011.01)
(52) U.S. Cl. .......................................... 700/97; 700/121
(58) Field of Classification Search .................... 700/97, 700/121
See application file for complete search history.

(56) References Cited

U.S. PATENT DOCUMENTS
2004/0148049 A1* 7/2004 Schwarm ....................... 700/121
2009/0005894 A1* 1/2009 Bomholt et al. ................. 700/97

OTHER PUBLICATIONS

Boning, D.S., Mozumder, P.K. "DOE/Opt: A System for Design of Experiments, Response Surface Modeling, and Optimization Using Process and Device Simulation". IEEE Transactions on Semiconductor Manufacturing vol. 7, No. 2 (1994): 233-244.*

* cited by examiner

*Primary Examiner* — Ryan A Jarrett
(74) *Attorney, Agent, or Firm* — Sawyer Law Group, P.C.

(57) ABSTRACT

The present invention is one or more implementations is a method of fabricating a semiconductor for improved oxide thickness control, defining a process tool, determining and evaluating performance variables, determining a performance impact factor and thereafter modifying control of the process tool in the fabrication process to operate in direct relation to the determined results of the present invention. The present invention sets forth definitive advantages in reducing engineering time, improving process controls and improving cycle-times.

8 Claims, 10 Drawing Sheets

PRIOR ART

100

PRIOR ART

190

402

SYSTEM AND METHOD FOR MATCHING SILICON OXIDE THICKNESS BETWEEN SIMILAR PROCESS TOOLS

FIELD OF THE INVENTION

The present invention relates generally to semiconductor wafer fabrication and more particularly but not exclusively to process control methodologies for maintaining consistent oxide thickness control.

BACKGROUND OF THE INVENTION

Demand for semiconductors, wafers, integrated circuits and semiconductor devices (i.e., collectively "semiconductors") continues to rapidly increase. With the continued market demand, there remain market pressures to increase the number of wafers that can be processed, reduce the geometries of finished wafers and their associated chip footprints, and increase component counts in the reduced geometries. Being able to sustain and meet the market demands with a reliable and consistent offering is a challenge however, in part because wafer manufacture is an environment that is both process sensitive and equipment intensive.

The fabrication of wafers (i.e., fabrication, fab, or fab environment) requires advanced processing equipment, unique toolings and extensive research efforts. Process tools (i.e., toolings) in these environments may often run in parallel or have multiple components to produce similar products (i.e., yields or outputs). Yet these same process tools, even when of the same manufacturer or source, may have unique variances in their individual performances which may create substantial or measurable differences in the quality of the products produced if unaccounted for.

A process tool may include a furnace, a furnace having a plurality of chambers, a furnace bank, a furnace tube, a processing chamber in which a wafer is acted upon, a processing activity point in a fab line where a wafer may be received or acted upon, and the like. In other aspects, a process tool may further include a controller or control mechanism for controlling a process tool and the tool's acts or actions with respect to the fab activity, in response to one or more commands, instruction sets, hardware or software commands, or other control-based directions of the controller.

As a result, in a traditional approach, it is often attempted to match the tool performance characteristics (TPCs), including machine characteristics, between process tools performing similar operations in one or more fab operations. With this approach, it is incorrectly believed that matched TPCs between similar process tools, even if identical in manufacturer and type, will result in identical or near-similar yields from each of the matched process tools. Unfortunately, even with matched process tools, yields are often subject to significant variance in what may otherwise appear to be an identical fab process.

An attempt to improve upon the traditional approach has also proven unfavorable where oxidation time of a particular process tool is adjusted in relation to the yield result so as to achieve a desired yield output and characteristic. Unfortunately, even with this attempted improvement, the traditional approach remains faulted as these time adjustments are limited to a single fab process for a single fab recipe on a particular process tool. This approach is not suited to accommodate typical fab production runs and foundry services having tens or hundreds of distinct processes being performed across tens or hundreds of process tools.

FIG. 1A depicts an example of a typical wafer 100 produced by a process tool in a process. In FIG. 1A, the wafer 100 has elements which may vary with respect to the type of process tooling and fab process undertaken in its manufacture, including a substrate 120 and a memory cell area 130. A memory cell often includes two or more field oxide areas (i.e., isolation regions) 110 which are often grown areas of oxide formed by a local oxidation of silicon (LOCOS) process.

The LOCOS process is in effect an isolation scheme commonly used in metal oxide semiconductors (MOS) and complementary MOS (CMOS) technology in which a thick pad of thermally grown SiO2 separates adjacent devices such as P-channel MOS and N-channel MOS transistors. Local oxidation is often accomplished by using silicon nitride to prevent oxidation of silicon in predetermined areas, and silicon is typically implanted between a silicon nitride region to form channel stops.

From FIG. 1A, the memory cell 130 is formed above an active area 140 of the substrate 120 and is situated typically between the adjacent field isolation regions 110. The memory cell 130 typically comprises a gate insulation layer 135 (i.e., tunnel oxide layer), a floating gate electrode 145 (often of polysilicon), a composite inter-poly insulation layer 150, and a control gate electrode 160 (often of polysilicon). In many implementations of the example of FIG. 1A, the insulation layer 150 is also known as an oxide-nitride-oxide (ONO) layer as it is often comprised of a layer of silicon dioxide 151, a layer of silicon nitride 152 and a layer of silicon dioxide 153, though other variations are also known.

From FIG. 1A, the thickness and dielectric constants of the floating gate electrode 135 and the layers of each of the ONO layer (i.e., 151, 152 and 153) may affect the overall performance of the memory cell and the associated integrated or electronic circuitry, depending on their thickness and formation details. Similarly there are also other characteristics of the memory cell related to physical structures, thickness, conductivity, uniformity, capacitance, band voltage, resistance, and growth impacts due to temperature and/or pressure during the deposition process, which may affect performance which directly results from a process tool's operation on the wafer (i.e., collectively "performance variables," "performance variances" or "performance characteristics").

Further, in the semiconductor fabrication field in particular, APC (advanced process control) may be employed in device manufacturing below 100 nm. The APC activities typically will need a stable thermal process, such as the one that significantly reduces wafer-to-wafer, batch-to-batch, and furnace-to-furnace differences, such that minimizing parameter variance is important when fabs process the same recipe, in multiple tools, for productivity and cycle time.

In a traditional furnace or furnace bank, there may exist more than one furnace tube in which a predetermined number of furnace tubes perform a similar process. FIG. 1B depicts a typical eight-tube furnace bank arrangement 190.

By example, the furnace bank of FIG. 1B is a process tool having two four-furnace banks at 191a and 191b, totaling eight similar separate tubes (i.e., furnace tubes) (191a, 191b, 191c, 191d, 191e, 191f, 191g, and 191h), each arranged to perform a furnace-based activity on a wafer set in the fab process. In a typical arrangement 190, each tube is arranged to receive a set of silicon wafers (192a, 192b, 192c, 192d, 192e, 192f, 192g, and 192h) which are typically received by the respective tube of the arrangement 190. In FIG. 1B, by example, wafer set 192h is about to be received into the proper bay area of furnace tube 191h, while all other wafer sets have been properly positioned in their respective tube bay. At 193a, 193b, 193c, 193d, 193e, 193f, 193g, and 193h are controllers each of which controls its respective furnace tube along 194*a* or 194*b*. A heat source is also an integral feature of a typical furnace (not shown). Once the wafers are inserted into the their respective tubes, the wafers are acted upon in accordance with the designated process, and thereafter removed. Once removed, yield variations of the wafers may be determined and compared.

Variances in the yield (e.g., produced semiconductor or memory cell) are often quantitatively determinable, even after attempting to traditionally match process tool or machine TPCs between similar process tools. Some of the yield variances can be determined quantitatively in the produced wafer's film thickness, stress, and dopant percentages, each of which is also directly associated with predictable comparative performances of the produced wafer.

With these traditional approaches, there are a number of limitations, however.

For instance, since yield variations and the associated results are uniquely dependent on at least both their respective process tools and specific fab recipes, in high capacity operations having substantial furnaces and recipe demands, significant numbers of recipes and/or equipment may need to be uniquely tailored and tuned for each process step. In such operations, even after these unique tunings are performed, further tunings may further be required in each tool every time there is even a minor adjustment needed to a tool, a recipe, or process.

In yet other instances, the traditional approaches are limited for furnace oxidation sequences where the oxidation time is varied for the same single recipe. With this approach, different oxidation times will yield oxides having different characteristics as each of the oxides in their respective tools are in effect growing at different rates and are therefore different. As a result time and temperature are not accurately controlled in the process sequence which is contrary to what is desired.

Therefore, optimally producing high-quality products in fab environment yielding consistency in produced wafers, fewer performance variances in process steps and reduced steps for recipe and process-specific tool variations, is desired. Additionally, limiting such performance variances commonly across a set of similar process tools, and in particular, improving consistency in yield output for similar-functioning but different process tools in a fab environment is also needed. Further, it is highly is desired to be able to match multiple differing line tools, such as furnaces, to develop consistency in process controls for oxide thickness control and particularly that of gate oxides.

The present invention in accordance with its various implementations herein, addresses such needs.

SUMMARY OF THE INVENTION

In one implementation of the present invention, a method of fabricating a semiconductor device using a process tool in a process for improved consistency control in oxide thickness formation, the method comprising: defining one or more performance variables of the process tool directly associated with oxide thickness formation in the process, conducting one or more experiments to determine at least one performance factor from the one or more performance variables, and modifying the process tool in the process to operate in relation to at least one performance factor, is set forth.

In another implementation, the present invention is an improved method of fabricating a semiconductor for improved oxide thickness control, comprising: defining a process tool in a fabrication process capable of acting on a semiconductor, determining one or more performance variables, evaluating the one or more performance variables affect on yield consistency in the process using the process tool, determining a performance factor, and modifying control of the process tool to operate in relation to the at least one performance factor.

In a further implementation, the present invention is a semiconductor device having one or more oxide gates of a general consistency developed from a process comprising: defining a process tool, determining one or more performance variables, determining a performance factor, and modifying control of the process tool in the fabrication process to operate in relation to the at least one performance factor, with one or more control rules.

In a further implementation, the present invention is a transistor having consistent oxide gates using the method of the present invention in one or more implementations.

In still a further implementation, the present invention is a computer program product for controlling a process having a process tool using the method of the present invention in one or more implementations.

DETAILED DESCRIPTION

The present invention relates generally to semiconductor wafer fabrication and more particularly but not exclusively to advanced process control methodologies for maintaining consistent oxide thickness control.

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

As used herein, the term "tools" and "process tools," whether singular or plural, are intended to include tools and equipment in the semiconductor fabrication process, without limitation, such as diffusion furnaces, atmospheric diffusion furnaces, low-pressure chemical vapor deposition (LPCVD) poly and nitride systems, and plasma-enhanced chemical vapor deposition PECVD) systems. Further, a tool or process tool, in an implementation of the present invention, may comprise equipment or tooling of a process and an associated controller for controlling the action of the tool. Similarly, a tool may further comprise a metrology tool. Operatively, a wafer is intended to be provided to the process tool where a process operation will be performed on the wafer. The controller of the tool may be used to affect a performance variable and its affect on a wafer. The controller may further use feed-forward or feedback metrology data to affect such performance variables, singly or in groups of more than one or more at a single instance.

Figure 1A:
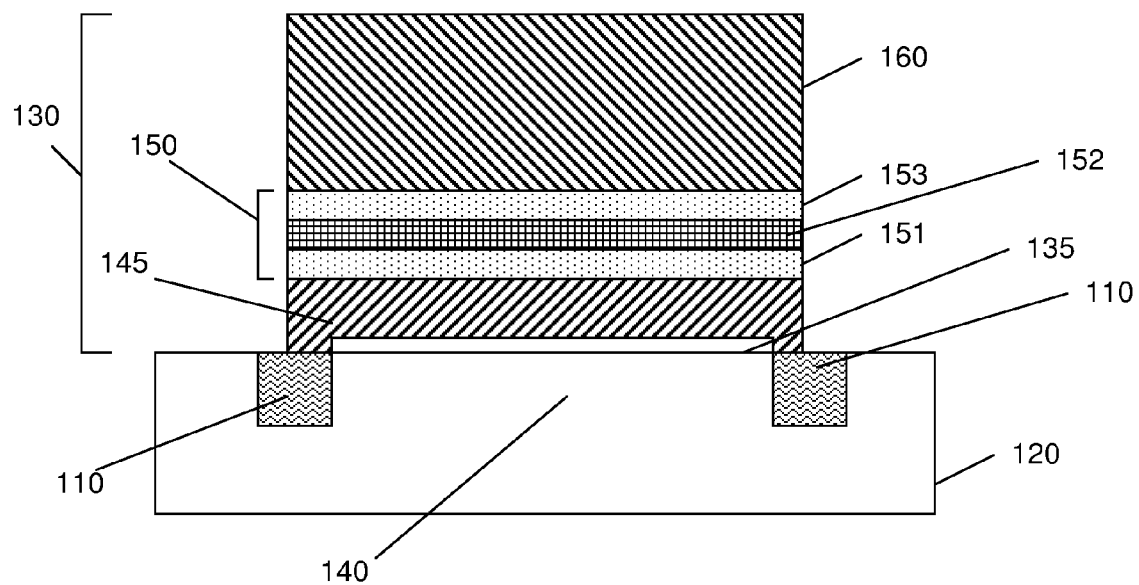
FIG. 1A depicts an example of a typical wafer, produced by a process tool in a process.
Figure 1B:
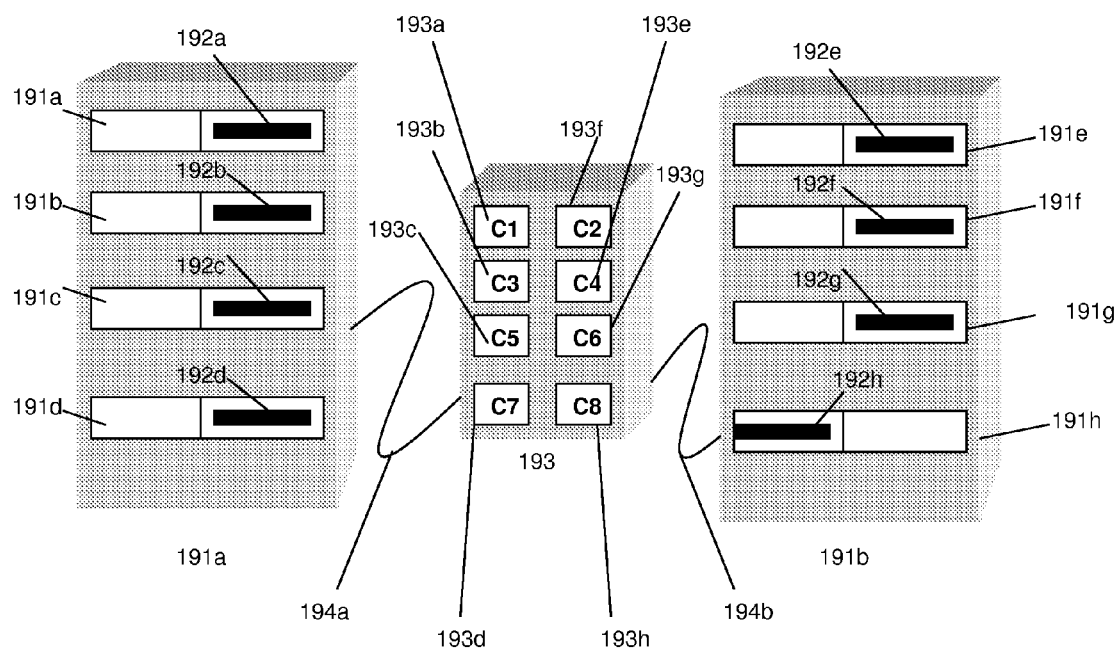
FIG. 1B depicts a typical eight tube furnace bank arrangement.
Figure 2:
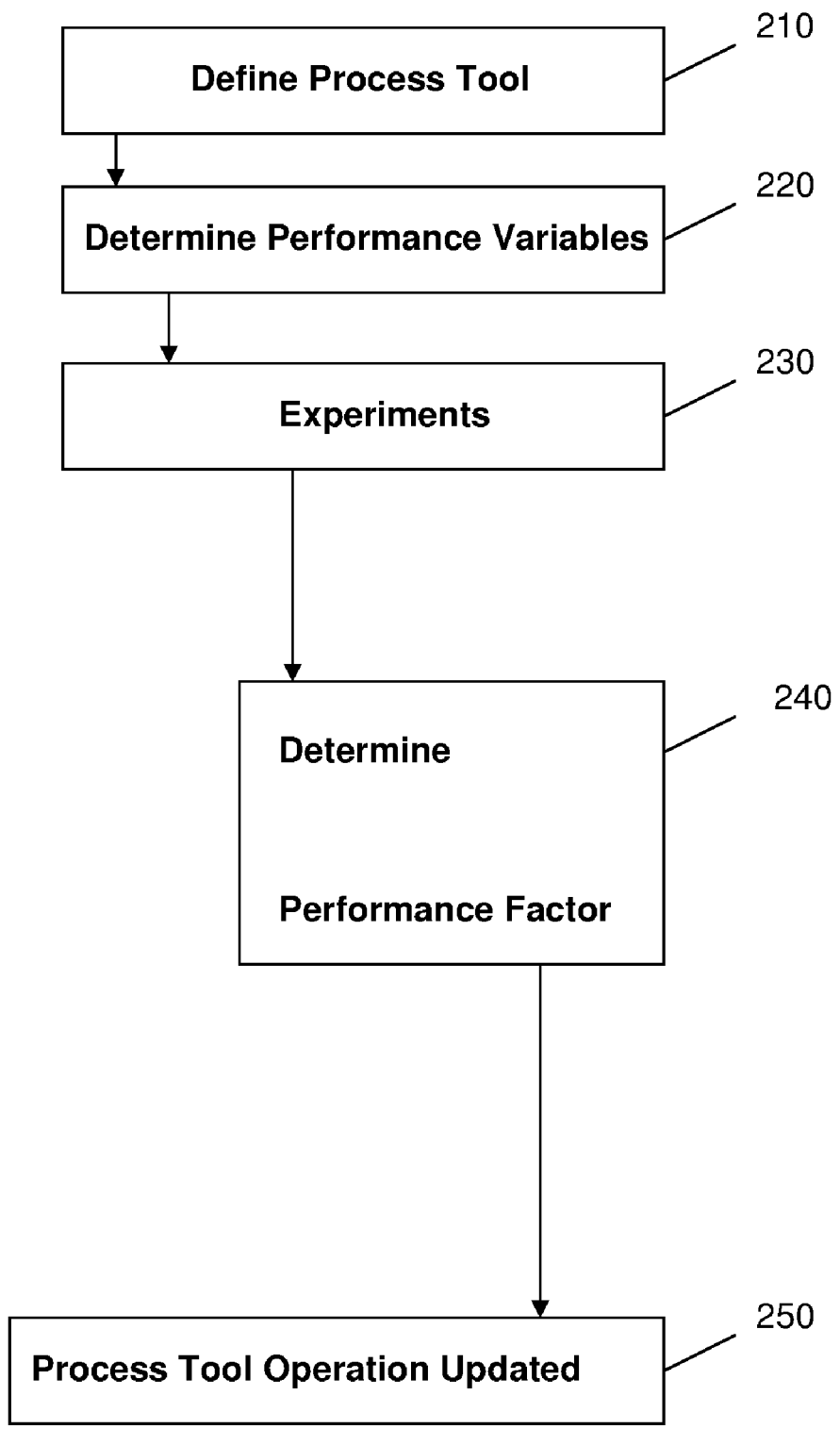
FIG. 2 depicts a process flow for an implementation of the present invention.

FIG. 2 depicts a process flow 200 for an implementation of the present invention. From FIG. 2, for a semiconductor fabrication process, a process tool is selected at 210.

With reference to the selection of the process tool at 210, performance variables of the process tool are determined at 220 and their respective potential fabrication impacts on performance of produced semiconductors (i.e., wafers) are determined by predetermined experimentation at 230. Experiments at 230 may be actual or modeled, one or more than one, a set, or sets of experiments, and may include physical experiments or virtual experimentation, without limitation. Experiments at 230 are conducted in view of one or more characteristics of the process tool (i.e., input, outputs, variables, operational limitations, etc.) which may affect the thickness and/or consistency of oxide formation.

Once the experiments of 230 are performed, an evaluation of results is conducted to determine performance factors of the process tool at 240, which may affect the thickness and/or consistency of oxide formation in one implementation. The determined performance factors may be a single variable or may include more than one. The determined performance factor of 240 is the critical performance factor for the process tool of the particular experiments of 230.

Once the performance factor is determined at 240, the process tool may be modified directly, by its controller, or by various input, output or other operative means to reflect the findings of the performance factor. For instance, a process tool controller may limit the operative aspects of the process tool for a particular performance characteristics (i.e., such as temperature) from the experimental results obtained. In limiting the process tool accordingly by the present invention, the process tool is operative only within a prescribed spectrum such that its operation is controlled to produce a consistent and predictable thickness of oxide for the semiconductor in its process operation. Thereafter, in a further implementation, additional analysis may be undertaken to further refine the findings and prepare a process operation operative to include optimal tool performance of one or more tools.

Figure 3A:
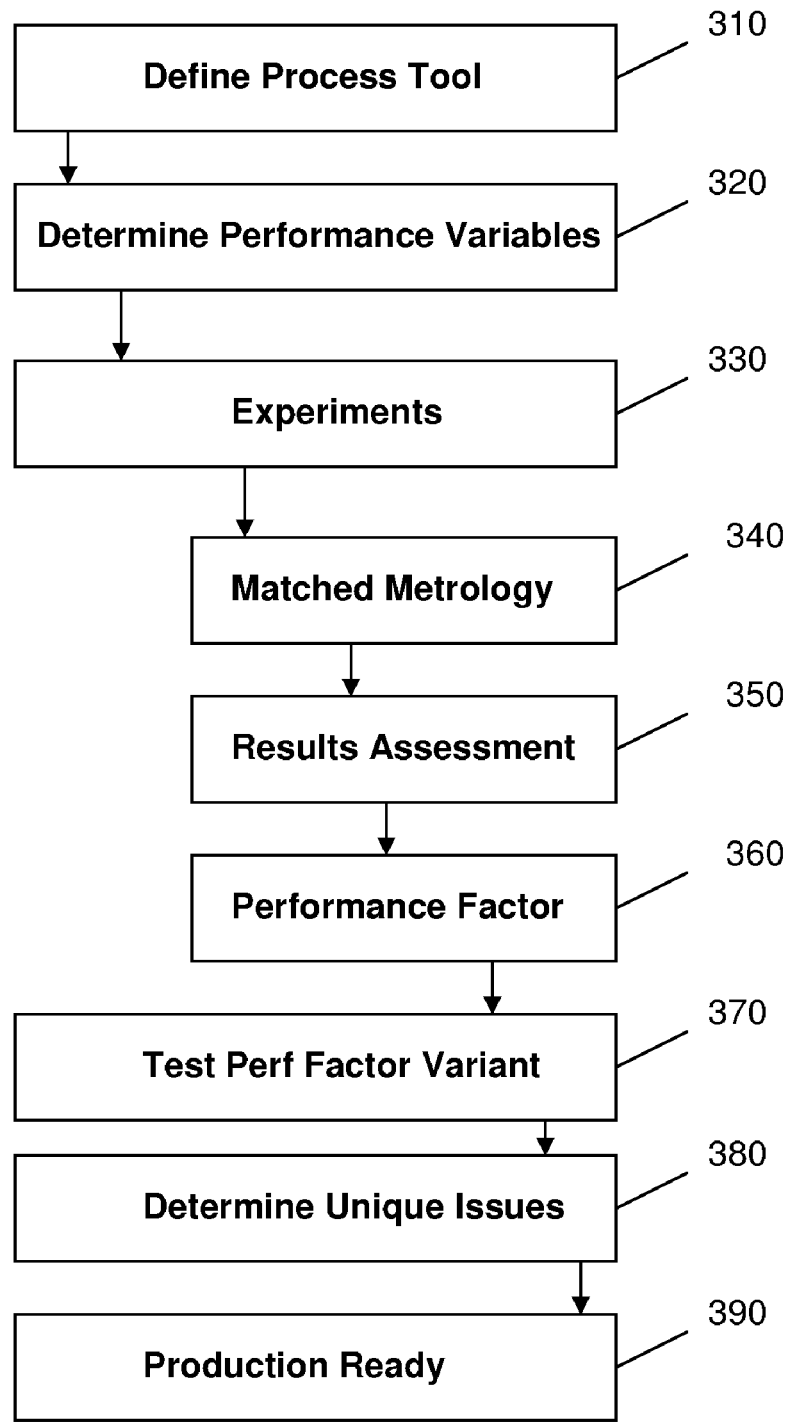
FIG. 3A depicts a particular process flow for a horizontal atmospheric furnace in accordance with an implementation of the present invention.

FIG. 3A depicts an example of a particular process flow 300 for a horizontal atmospheric furnace, in accordance with an implementation of the present invention.

From FIG. 3A, the Process Tool of a horizontal atmospheric furnace is selected at 310. In reference to the selection at 310, performance variables of the horizontal atmospheric furnace are determined at 320 and their respective potential fabrication impacts on performance of produced wafers are determined by predetermined experimentation at 330. Experiments at 330 may be actual or modeled, and may include physical experiments or virtual experimentation, without limitation.

By way of example, a set of experiments in a particular implementation of the present invention was developed. The set of experiments including using a 100% dry $O_2$ recipe commonly for each experiment in the set in which after the recipe was run, oxide thicknesses of tube-to-tube comparison were performed. The set of experiments, which may be further associated with FIG. 3A, included matching metrology capabilities (i.e., film measurement metrology and machine parameter metrology) at 340 and the experiments included: (i) measuring profile thermocouple (TC) mV outputs between furnace tubes during fabrication at set intervals of time; (ii) measuring fixed DC mV values input into furnace controllers; and, (iii) assessing dry oxide growth rates for matched furnace tubes within the metrology capability, in relation to hardware and firmware.

From the set of experiments conducted, results of measuring the oxide thicknesses of tube-to-tube comparisons at 350 indicated the following: (i) when measuring profile thermocouple (TC) mV outputs between furnace tubes during fabrication at set intervals of time, no detectable or significantly measurable differences were determined; (ii) when measuring fixed DC mV values input into furnace controllers, no detectable or significantly measurable differences were determined; and, (iii) when assessing dry oxide growth rates for matched furnace tubes within the metrology capability, differing dry oxide growth rates were apparent. Since the differing dry oxide growth rates were measurable, a growth rate performance factor (i.e., apparent growth temperature offset) was identified at 360 as the critical performance factor for the process tool of this particular set of experiments.

At 370, the performance factor is tested with respect to the process tool of the original experiment set, and for this particular experiment, the controller of the furnace control software was then programmed with a thermocouple (TC) calibration offset in relation to the dry oxide growth rate of a furnace. For instance, if a furnace demonstrated a higher dry oxide growth rate, a positive TC offset would be programmed with the controller of the furnace control software to reduce the water temperature used in the furnace. Since the offset affects a global performance variable for the furnace (or tool) particularly, each recipe undertaken by the furnace having its respective offset would not require any further or unique modification, as set forth at 380.

In preparing the offset findings for production, a further assessment is undertaken to determine possible ranges of the offset, or banding, at 390. For production, with respect to the tool of interest, and more particularly for the horizontal atmospheric furnace, it is of interest to provide guard bands on the determined offset to control the furnace and avoid using temperature directly to compensate for other process tool variables. By further experimentation, it was determined for this experiment set that a guard range of temperature operation was determinable.

Figure 3B:
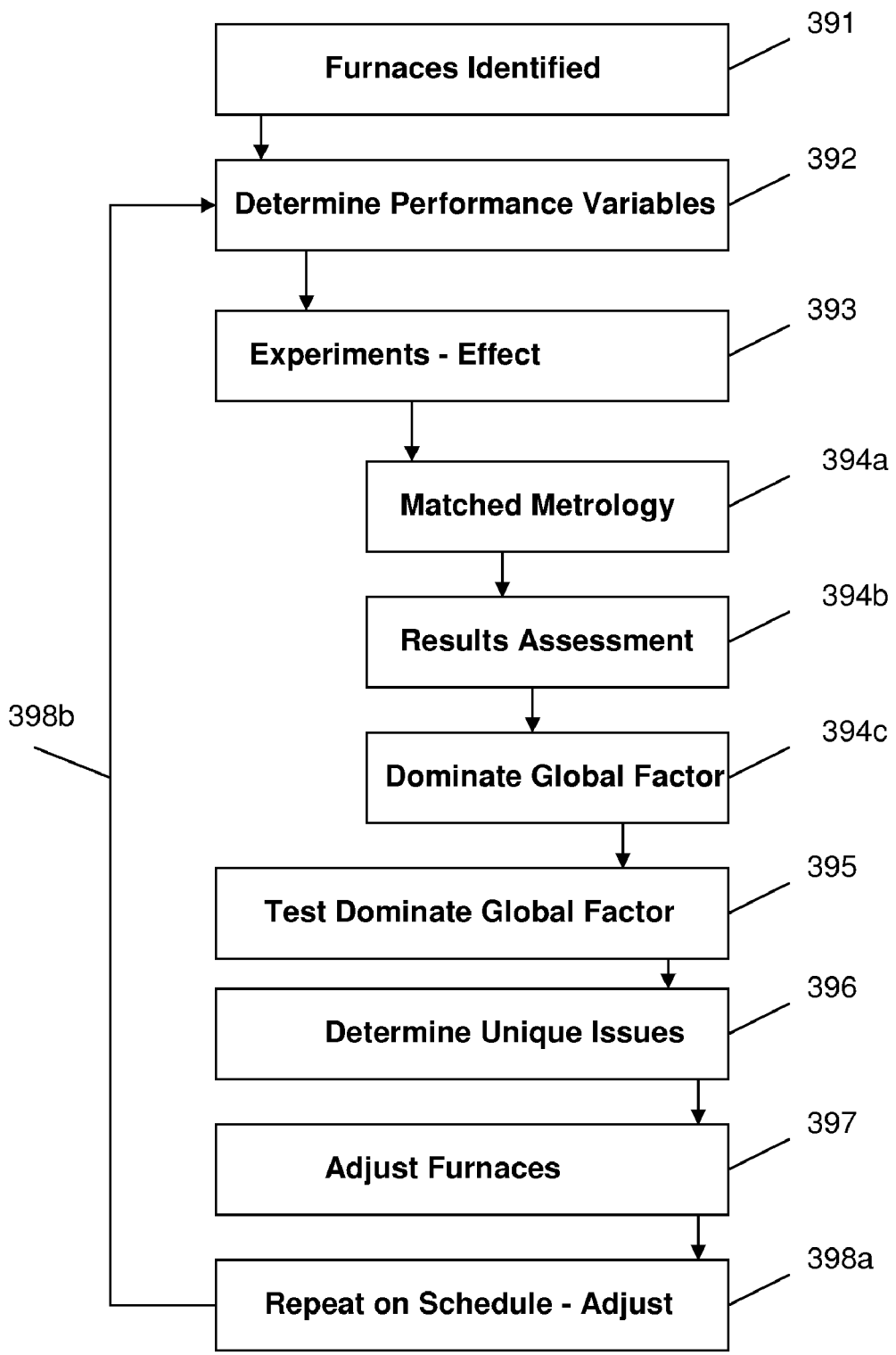
FIG. 3B depicts an example of a particular process flow 399 for a set of horizontal atmospheric furnaces with a predetermined evaluation schedule for adjustment, in accordance with an implementation of the present invention.

FIG. 3B depicts an example of a particular process flow 399 for a set of horizontal atmospheric furnaces with a predetermined evaluation schedule for adjustment, in accordance with an implementation of the present invention.

From FIG. 3B, the set of horizontal atmospheric furnaces are predetermined at 391. For the example of the present implementation, the set of furnaces comprise eight furnace tubes and a controller set having single control capability for each controller of each furnace tube. The performance variables of the furnace set are determined at 392 where performance variables such as time, temperature, pressure, gas flow, and wafer positioning are evaluated for inclusion in experimentation to determine the impact and effect of the performance variables at 393. Experiments at 393 for the implementation were determined to be actual experiments where trials were run.

One of the experiments of a set of experiments at 393 was defined to include determining the thickness of oxide from yield results of each furnace tube, using a 100% dry O2 recipe commonly for each experiment. The set of experiments, which may be further associated with FIG. 3B, included matching metrology capabilities (i.e., film measurement metrology and machine parameter metrology) in preparation for experiments at 394a. As part of the experiment set, three experiments were conducted to determine and identify a dominant global factor (i.e., a primary performance factor which commonly affected all recipes of a process tool). The experiment set included: (i) measuring profile thermocouple (TC) mV outputs between furnace tubes during fabrication at predetermined intervals of time; (ii) measuring fixed DC mV values input into furnace controllers of each furnace tube; and, (iii) measuring temperatures between furnace tubes.

From the set of experiments conducted, results were assessed at 394b. The results of the experiments identified a single common performance factor of differing dry oxide growth rates for yields from the various furnace tubes. Based on these results at 394b, the dominant global performance factor of apparent growth temperature offset was determined at 394c in relation to process tools of 391.

At 395, the dominant global performance factor was tested with respect to the various furnace tubes, with their associated controllers each being programmed with a thermocouple (TC) calibration offset in relation to the dry oxide growth rate of the respective furnace tube. Additional yields for the furnace tubes were then produced with respect to the implemented dominant global performance factor as an associated offset, with guard bands having been programmed into the controller for all oxidations (wet or dry) between 850 degrees C. and 1200 degrees C. No unique issues or further adjustments to the factor were identified as being required at 396. Similarly, as no further adjustments were required, the earlier controls set for each furnace tube at 395 were effectively completed for an adjusted furnace tube, ready for production at 397.

Accordingly, at 398a, each furnace tube, in view of certain equipment characteristics or TPCs of each tube, was provided with n evaluation date (EVAL). The EVAL was determined uniquely for each furnace tube in relation to its age, performance history, repair history, manufacture, and similar characteristics. The EVAL date was then set forth for each furnace tube, where upon the occurrence of an EVAL date, a second assessment using an implementation of the present invention was conducted per 398b.

Figure 3C:
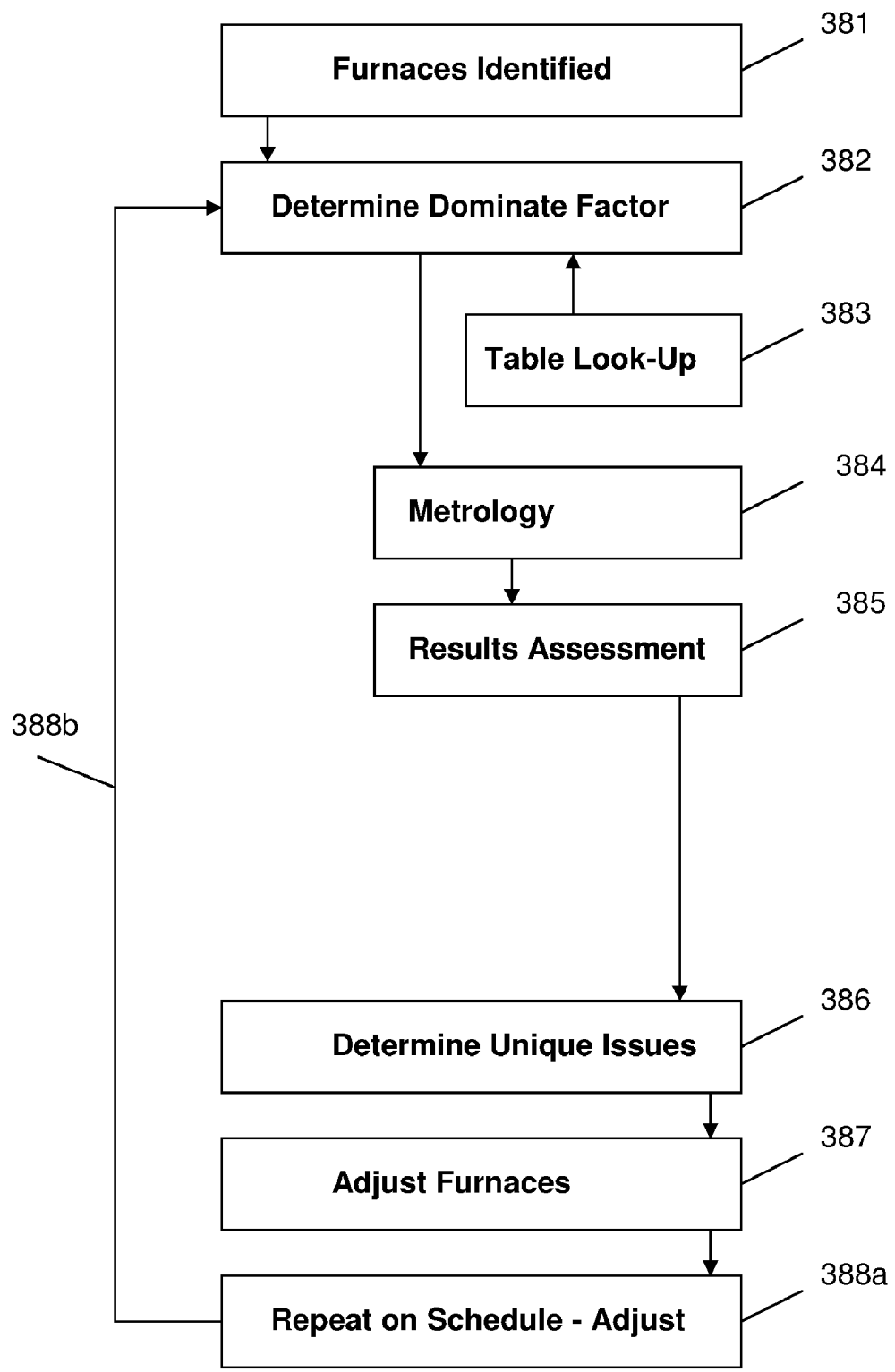
FIG. 3C depicts an example of a particular process flow for a set of horizontal atmospheric furnaces using a predetermined factor, in accordance with an implementation of the present invention.

In a further implementation of the present invention, a reference table is used to determine a performance factor. FIG. 3C depicts an example of a particular process flow 389 for a set of horizontal atmospheric furnaces using a predetermined factor, in accordance with an implementation of the present invention. From FIG. 3C, in accordance with data derived from a series of empirical experiments of process tools in a fab environment, a performance factor is defined without experimentation as set forth in Table 1.

TABLE 1

| Process Tool | Factor |
|---|---|
| LPCVD (Polysilicon) | Process Pressure |
| LPCVD (Nitride) | Temperature |
| PECVD | Silane Gas Flow |
| Atmospheric Tube | Temperature |

In accordance with Table 1, where the process tool is an atmospheric furnace, the factor determined to be a global factor common to affect all recipes of a process tool is temperature.

From FIG. 3C, a set of horizontal atmospheric furnaces are predetermined at 381. The performance variables of the furnace sets are determined at 382 in accordance with Table 1, at 383. From Table 1, the dominant performance factor for the present implementation of FIG. 3C is defined to be temperature. Process tool metrology is determined at 384. Yields for the furnace tubes are then produced with respect to the implemented dominant global performance factor of temperature as an associated offset, with guard bands having been programmed into the controller for all oxidations (wet or dry) between 850 degrees C. and 1200 degrees C., at 385. No unique issues or further adjustments to the factor or process tools were identified as being required at 386. Similarly, as no further adjustments were required, the earlier controls set for each furnace tube at 385 were effectively completed for an adjusted furnace tube, ready for production at 387. Further, at 388a, each furnace tube, in view of certain equipment characteristics or TPCs of each tube, was provided with n evaluation date (EVAL). The EVAL was determined uniquely for each furnace tube in relation to its age, performance history, repair history, manufacture, and similar characteristics. Optionally, the EVAL for a process may also be determined in view of the process tool set, the fab line or any one or more characteristics of any of the process tools therein. The EVAL date was then set forth for each furnace tube, where upon the occurrence of an EVAL date, a second assessment using an implementation of the present invention was conducted per 388b.

Although Table 1 was provided for the example of FIG. 3C, it will be appreciated that the present invention is not so limited as an alternative table, look-up program instructional, or computer code parameter may be employed having differing factors, offsets, relational variables and variants, step functions, and other alternative relationships in result to or in relation to further experiments, testing and similar events as may be predetermined by a user.

Figure 4A:
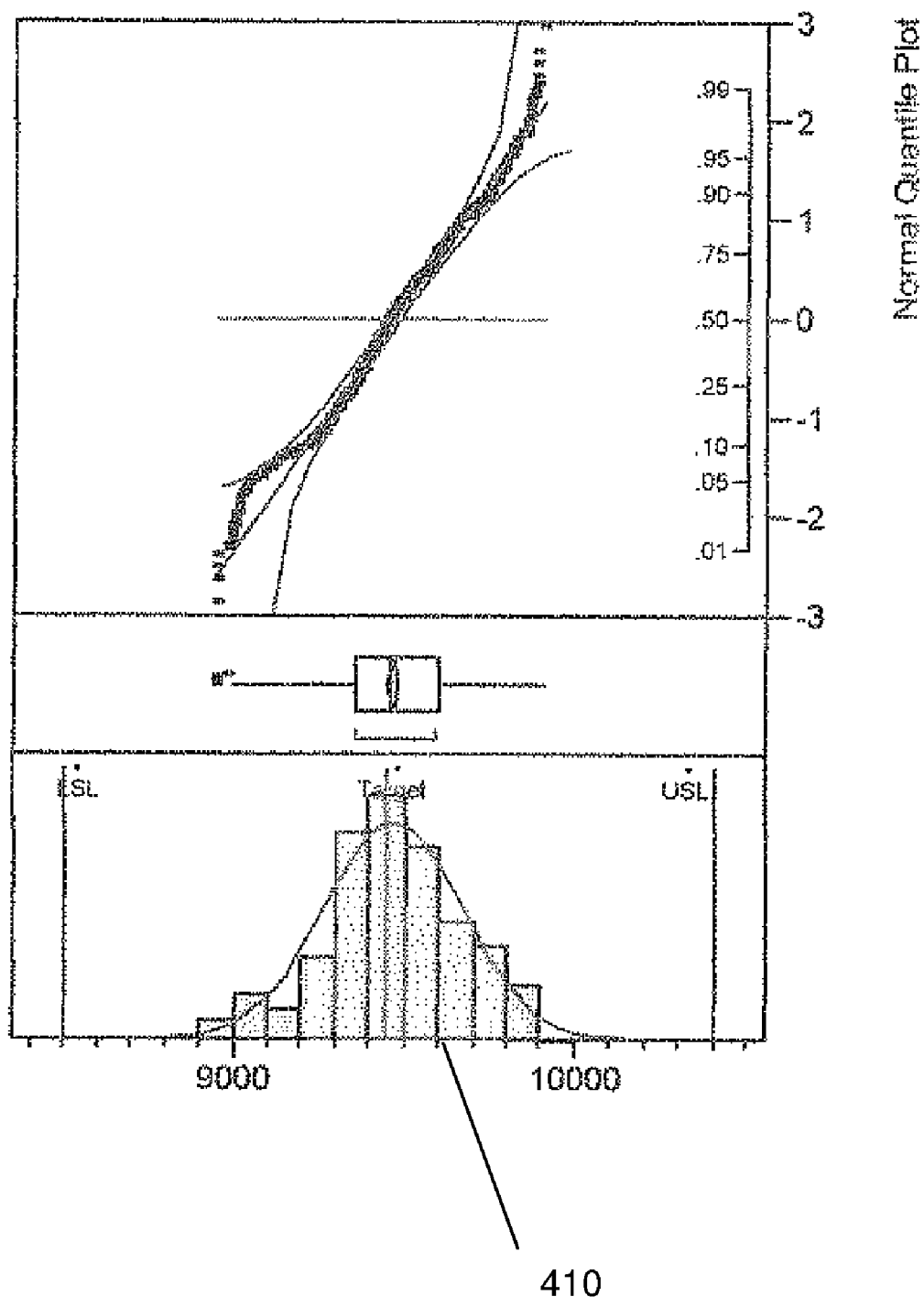
FIG. 4A depicts results for field oxidation of an experiment set for a horizontal atmospheric furnace, including an associated distribution result, without temperature matching, using a traditional approach.
Figure 4B:
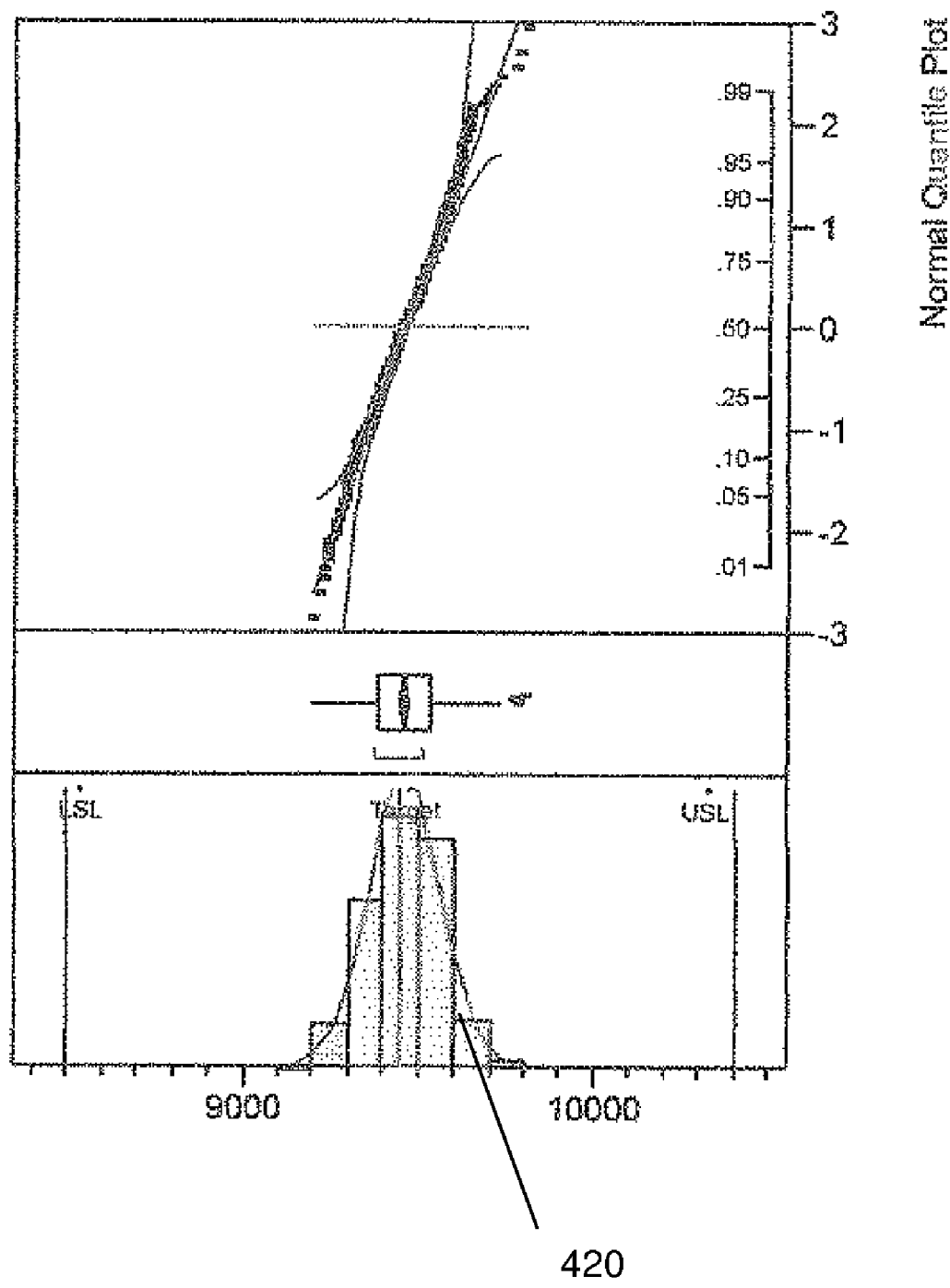
FIG. 4B depicts results for field oxidation of an experiment set for a horizontal atmospheric furnace, including an associated distribution result, with temperature matching, in accordance with an implementation of the present invention.

FIG. 4A depicts results 401 for field oxidation of an experiment set for a horizontal atmospheric furnace, including an associated distribution result, without temperature matching, using a traditional approach. FIG. 4B depicts results 402 for field oxidation of an experiment set for a horizontal atmospheric furnace, including an associated distribution result, with temperature matching, in accordance with an implementation of the present invention. FIG. 4A shows a wider distribution at 410 using a traditional approach and FIG. 4B shows a narrower distribution at 420 with the offset of the experiment set in accordance with an implementation of the present invention.

Figure 5A:
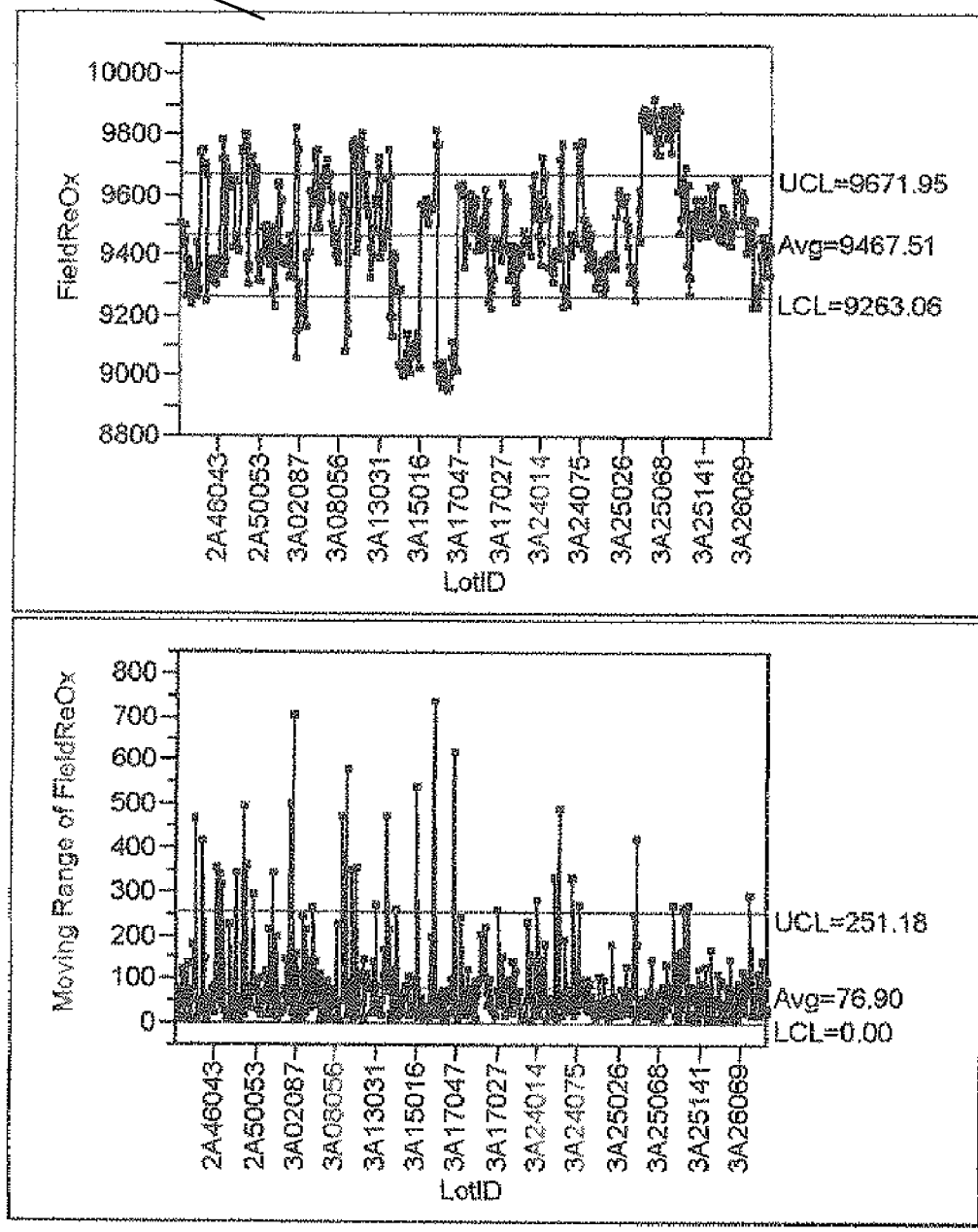
FIG. 5A depicts results for field oxidation of an experiment set for a horizontal atmospheric furnace, including a field oxide thickness association, without temperature matching, using a traditional approach.
Figure 5B:
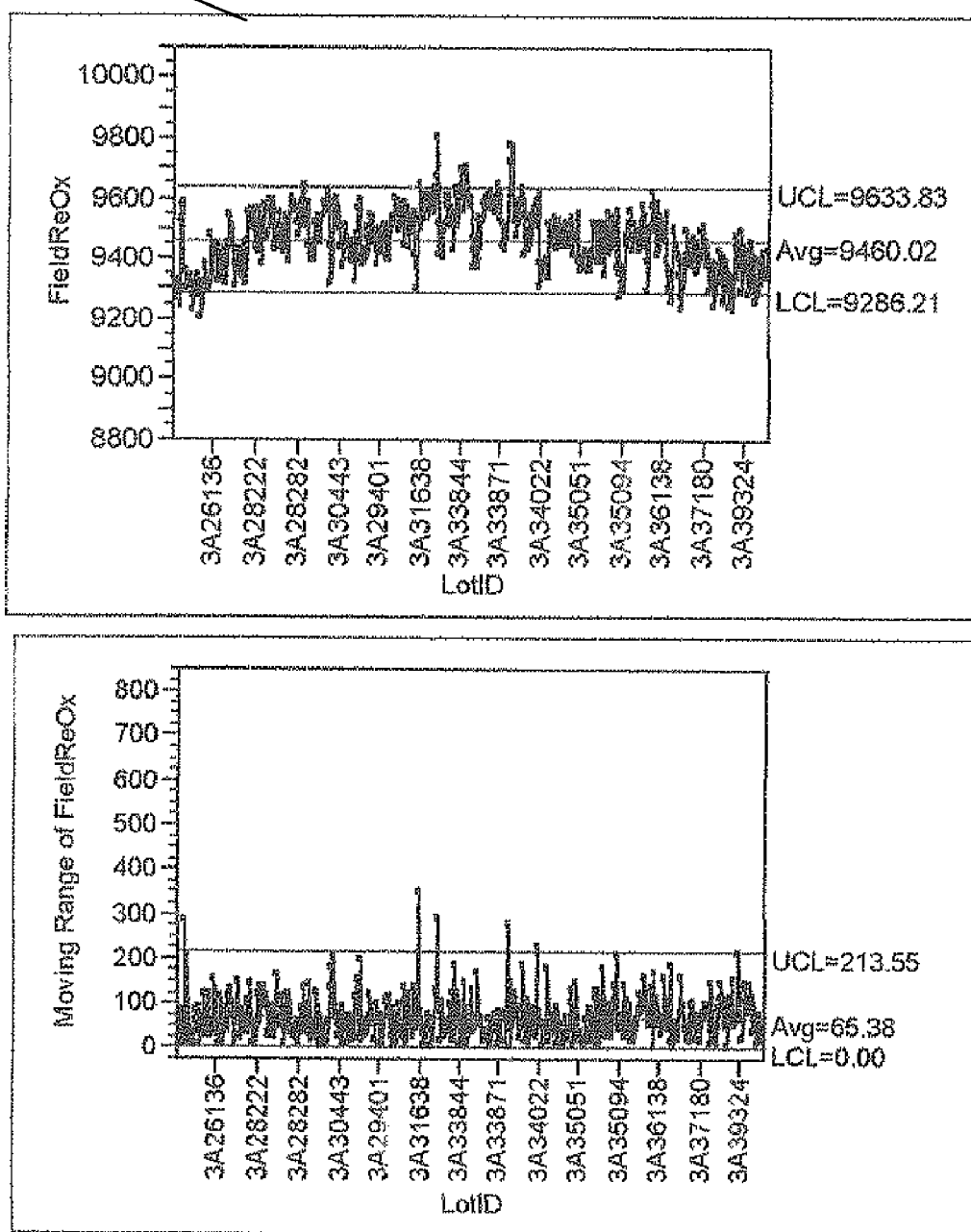
FIG. 5B depicts results for field oxidation of an experiment set for a horizontal atmospheric furnace, including a field oxide thickness association, with temperature matching, in accordance with an implementation of the present invention.

FIG. 5A depicts results 501 for field oxidation of an experiment set for a horizontal atmospheric furnace, including a field oxide thickness association, without temperature matching, using a traditional approach. FIG. 5B depicts results 502 for field oxidation of an experiment set for a horizontal atmospheric furnace, including a field oxide thickness association, with temperature matching, in accordance with an implementation of the present invention. FIG. 5A shows a wider distribution at 510, without temperature matching using a traditional approach and FIG. 5B shows a narrower distribution at 520 with temperature matching.

Using the method of the present invention in accordance with a further particular implementation for a PECVD film, an experimental set involving the deposition of phospho-silicate glass (PSG), boron-phospho-silicate glass (BPSG), undoped silicate glass (USG) and other variants of silicon nitride were deposited and tested to determine the performance factor. In this manner, for this implementation of the present invention, the traditional approach is avoided and a performance factor associated with deposition rate is determined as being common to the processes to be undertaken by the process tool. Tool information was also supplemented using vendor-based information of the tool as well as historical data from experiential testing. Test results indicated that silane gas flow was the performance factor of interest for the specific experimental set. Results of the experimental agree with the understanding that control stability of PECVD gases is generally reasonable, except for silane, as silence mass flow controllers (MFCs) drift due to gas phase reactions inside the typical narrow flow tube.

The experimental set, in accordance with an implementation of the present invention, determined guard limits for silane correction factors. Further, the resulting ability to control oxide thickness also realized significant improvement in dopant (B and P) control.

By way of further example, using the method of the present invention in a further implementation, similar results yielding deposition pressure in relation to polysilicon and temperatures for nitride (Low-pressure chemical vapor deposition (LPCVD) poly and nitride) were also successfully determined.

The present invention is further advantageous over traditional methods as no additional upgrades are required in the functional or operative nature of the fab process to which it impacts, as in general, performance variables are determined within the existing process and modifications within the process and its aspects are determined as a result of the present invention, resulting in less engineering time, improved process controls and improved cycle-times. A further advantage is that the present invention does not require the need to "profile" tooling such as furnaces, contradistinctive to the traditional approach, but instead, the present invention may be operable using a routine dry oxidation recipe. Additionally, further analysis has demonstrated that the present invention also extends changeout cycles of TCs and the need for vendor calibration formalities is reduced.

As used herein, it will be understood by those in the art that in practice, a memory array may be comprised of thousands of the memory cells.

As used herein the terms "performance variables," "performance variances" and "performance characteristics" are intended to include but not be limited to characteristics of a semiconductor resulting from a process tool which may affect the overall performance of the semiconductor and its associated integrated or electronic circuitry, if any, including film thickness, stress and dopant percentages, oxide thickness, dielectric constants of the floating gate electrode and layers of the ONO layer, physical attributes, footprint, shape, formation details, thickness, conductivity, uniformity, capacitance, band voltage, resistance, and growth impacts dues to temperature and/or pressure during the deposition process, as well as similar characteristics which may affect performance.

As used herein, it is envisioned that the process tool controller may be hardware, software, firmware, or combinations thereof, in its composition and operation, and may therefore further comprise software, instructional code, other applications, and be a computer program product.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

Various implementations of a wafer process and methods for fabricating the wafer have been described. Nevertheless, one of ordinary skill in the art will readily recognize that various modifications may be made to the implementations, and any variations would be within the spirit and scope of the present invention. For example, the above-described process flow is described with reference to a particular ordering of process actions. However, the ordering of many of the described process actions may be changed without affecting the scope or operation of the invention. Accordingly, many modifications may be made by one of ordinary skill in the art without departing from the spirit and scope of the following claims.

What is claimed is:

1. A method of fabricating a semiconductor device using a process tool in a process for improved consistency control between multiple, similar process tools, in oxide thickness formation, the method comprising:
    defining one or more performance factors of the multiple, similar process tools directly associated with oxide thickness formation in the process,
    conducting one or more experiments to determine at least one key performance factor from the one or more performance factors, and
    modifying the multiple, similar process tools to operate in relation to the at least one key performance factor.

2. The method of claim 1, wherein the process is a semiconductor wafer fabrication involving an oxidation of silicon process and further comprising multiple, similar process tools.

3. The method of claim 2, wherein the at least one key performance factor comprise one or more of physical structure, oxide thickness, uniformity, and growth rate due to temperature and/or pressure during a deposition process.

4. The method of claim 3, wherein the one or more experiments includes using a recipe.

5. The method of claim 3, wherein the process is one of a stability control system, a low-pressure chemical vapor deposition or plasma-enhanced chemical vapor deposition system.

6. The method of claim 3, wherein the one or more experiments yields at least one key performance factor that is a function of one or more of: pressure, temperature, gas flow, exhaust, temperature ramp, a factor associated therewith, or a combination of one or more thereof.

7. The method of claim 6, further comprising at least one process tool controller in communication with the multiple, similar process tools.

8. The method of claim 7, wherein the at least one process tool controller is programmable to modify the multiple, similar process tools operations in response to the at least one key performance factor.

* * * * *